(12) United States Patent
Wright et al.

(10) Patent No.: US 8,961,231 B2
(45) Date of Patent: Feb. 24, 2015

(54) RETENTION MECHANISMS FOR ELECTRICAL CONNECTORS

(71) Applicant: Apple Inc., Cupertino, CA (US)

(72) Inventors: Derek W. Wright, San Francisco, CA (US); Alex Yeung, San Francisco, CA (US); Steve McClure, San Francisco, CA (US); Sean S. Corbin, San Jose, CA (US); John B. Ardisana, II, San Francisco, CA (US); Benjamin J. Pope, San Francisco, CA (US); Shayan Malek, San Jose, CA (US)

(73) Assignee: Apple Inc., Cupertino, CA (US)

( * ) Notice: Subject to any disclaimer, the term of this patent is extended or adjusted under 35 U.S.C. 154(b) by 69 days.

(21) Appl. No.: 13/719,187

(22) Filed: Dec. 18, 2012

(65) Prior Publication Data

US 2014/0170866 A1 Jun. 19, 2014

(51) Int. Cl.
*H01R 13/648* (2006.01)
*H05K 3/36* (2006.01)
*H01R 13/6582* (2011.01)

(52) U.S. Cl.
CPC ............ *H05K 3/368* (2013.01); *H01R 13/6582* (2013.01)
USPC .......................... 439/607.54; 439/74; 439/350

(58) Field of Classification Search
USPC ......... 439/607.54, 607.56, 74, 349, 350, 368, 439/65
See application file for complete search history.

(56) References Cited

U.S. PATENT DOCUMENTS

| | | | | |
|---|---|---|---|---|
| 4,169,643 A | * | 10/1979 | Gallagher | 439/369 |
| 4,643,505 A | * | 2/1987 | House et al. | 439/369 |
| 4,749,363 A | * | 6/1988 | Luska et al. | 439/367 |
| 5,061,194 A | * | 10/1991 | Herman et al. | 439/133 |
| 5,135,409 A | * | 8/1992 | Thompson | 439/367 |
| 5,545,051 A | * | 8/1996 | Summers et al. | 439/350 |
| 5,913,692 A | * | 6/1999 | Targett | 439/369 |
| 6,749,459 B2 | * | 6/2004 | Urbaniak et al. | 439/496 |
| 7,513,790 B2 | * | 4/2009 | Keeven et al. | 439/369 |
| 7,713,081 B2 | * | 5/2010 | Chen | 439/468 |
| 8,021,187 B2 | | 9/2011 | Tagawa et al. | |
| 8,083,527 B2 | | 12/2011 | Takeuchi et al. | |
| 8,142,226 B2 | * | 3/2012 | Xiao et al. | 439/607.56 |
| 8,408,929 B2 | * | 4/2013 | Solon | 439/301 |
| 2005/0085128 A1 | * | 4/2005 | Chai et al. | 439/607 |
| 2006/0228944 A1 | * | 10/2006 | Tsai | 439/607 |
| 2011/0255850 A1 | | 10/2011 | Dinh et al. | |
| 2011/0275233 A1 | * | 11/2011 | Benear | 439/278 |
| 2012/0071015 A1 | * | 3/2012 | Debock et al. | 439/271 |
| 2012/0122332 A1 | | 5/2012 | Zhu | |
| 2013/0102181 A1 | * | 4/2013 | Aimoto | 439/350 |

* cited by examiner

*Primary Examiner* — Gary Paumen
(74) *Attorney, Agent, or Firm* — Kilpatrick Townsend & Stockton LLP

(57) ABSTRACT

An improved electrical connector retainer employs a shell having a cavity. A pair of mated electrical connectors are received within the cavity and at least a portion of an upper wall of the shell is deflected towards a lower wall of the shell. The shell is configured to retain the upper wall in the deflected position, maintaining the pair of connectors in the mated position.

19 Claims, 10 Drawing Sheets

RETENTION MECHANISMS FOR ELECTRICAL CONNECTORS

BACKGROUND OF THE INVENTION

The present invention relates generally to electrical connectors and in particular to retention mechanisms that secure electrical connectors in a mated position.

A wide variety of applications employ electrical connectors. Electronic devices such as smart-phones, media players and laptop computers may use a plurality of both external and internal electronic connectors. While the external connectors may facilitate communication with other electronic devices, the internal connectors may facilitate communication between electronic components within the electronic device. Typically, during assembly of an electronic device the internal components are electrically interconnected by mating one or more internal connectors. Once the internal connectors are mated, it may be necessary to secure them in the mated position with a retention mechanism to ensure reliable operation of the electronic device.

As smart-phones, media players, laptop computers and other electronic devices become more compact and cost competitive, various components within each such device are being designed to be smaller and as low-cost as possible.

BRIEF SUMMARY OF THE INVENTION

Embodiments of the invention pertain to technology that is particularly useful in the manufacture and use of retention mechanisms for electronic connectors that need to be retained in a mated position.

Some embodiments relate to the formation of a shell having a receiving opening configured to receive a mated pair of connectors, and a rear face disposed opposite of the receiving opening. The shell may further have an upper wall opposite a lower wall and a first sidewall opposite a second sidewall. The walls may extend between the receiving opening and the rear face, defining a cavity that communicates with the receiving opening. The mated connectors may be placed within the cavity and at least a portion of the upper wall of the shell may be defected towards the lower wall of the shell. The shell may further be configured to retain the upper wall in the deflected position, applying pressure to the mated connectors and retaining them in the mated position.

Some embodiments may retain the upper wall in a deflected position by mechanically deforming or crimping a portion of the upper wall. Other embodiments may retain the upper wall in a deflected position by hingedly connecting a portion of the upper wall to a sidewall of the shell and latching another portion of the upper wall to one or more sidewalls of the shell. Further embodiments may have an upper wall with one or more lips that are latched to corresponding lips disposed on a lower wall.

Some embodiments may form a latching mechanism by forming teeth that are configured to be received in recesses. A latch may be formed by overlapping a portion of a first wall with a portion of a second wall. Teeth may be disposed on the overlapping portion of the first wall and configured to fit within recesses disposed in the overlapping portion of the second wall.

To better understand the nature and advantages of the present invention, reference should be made to the following description and the accompanying figures. It is to be understood, however, that each of the figures is provided for the purpose of illustration only and is not intended as a definition of the limits of the scope of the present invention.

DETAILED DESCRIPTION OF THE INVENTION

Certain embodiments of the present invention relate to retention mechanisms for electrical connectors. While the present invention can be useful to produce retention mechanisms for a wide variety of connectors, some embodiments of the invention are particularly useful for producing a retention mechanism for internal electronic connectors employed in compact electronic devices.

Figure 1A:
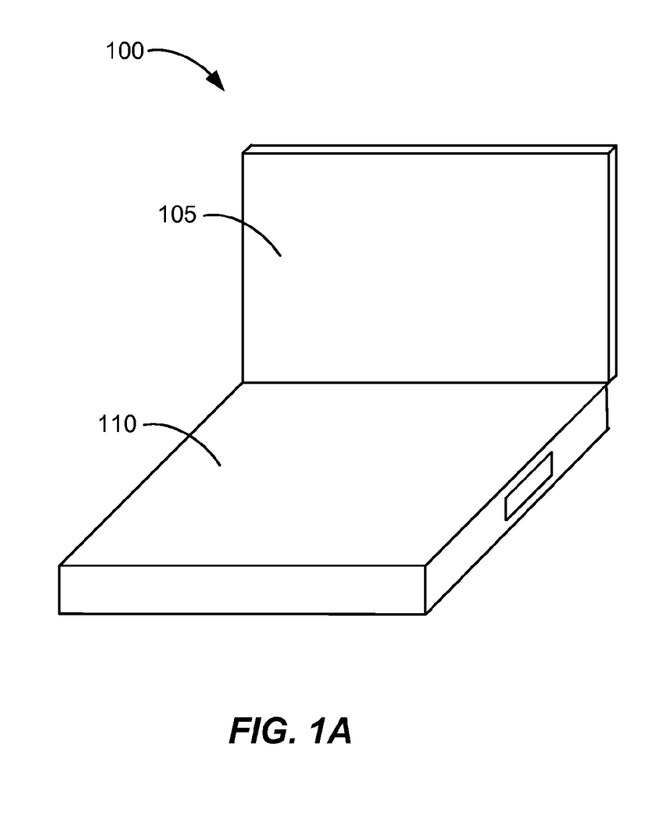
FIG. 1A is a diagram that illustrates an example of an electronic device having interconnected electronic components in accordance with an embodiment of the invention.
Figure 1B:
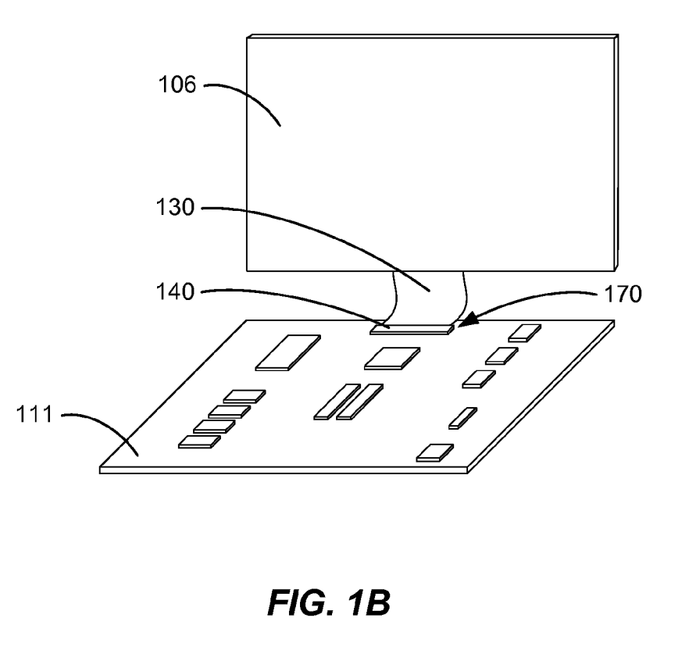
FIG. 1B is a diagram that illustrates an example of interconnected electronic components in accordance with an embodiment of the invention.

Many electronic devices such as smart-phones, media players and laptop computers may have internal electronic connectors within them that facilitate communication between internal electronic components. FIGS. 1A and 1B illustrate an example of such a connector as employed in laptop computer 100. Laptop computer 100 may have a viewing screen 105 and a lower chassis 110. Various electronic components within computer 100 are illustrated in FIG. 1B. Viewing screen 105 may comprise an LCD display 106 with flexible PCB 130 electrically coupled to motherboard 111 using internal electronic connector 140 that includes a plug connector portion attached to one of motherboard 111 and flex circuit 130 and a receptacle connector portion attached to the other of motherboard 111 and flex circuit 130. More specifically, when the plug portion of internal electronic connector 140 is mated with the receptacle portion of the internal electronic connector, electrical contacts within each electronic connector (not shown) are in physical and electrical contact with each other to allow electrical signals to be transferred between motherboard 111 and LCD screen 106. Retention mechanism 170, in accordance with embodiments of the invention, may be employed on internal electronic connector 140, or on other connectors, to maintain the connectors in a mated position during the assembly and use of laptop computer 100.

To further illustrate embodiments of the invention, various examples of retention mechanisms for electrical connectors that may be made in accordance with the present invention are discussed below, however these embodiments should in no way limit the applicability of the invention to other connectors.

Figure 2:
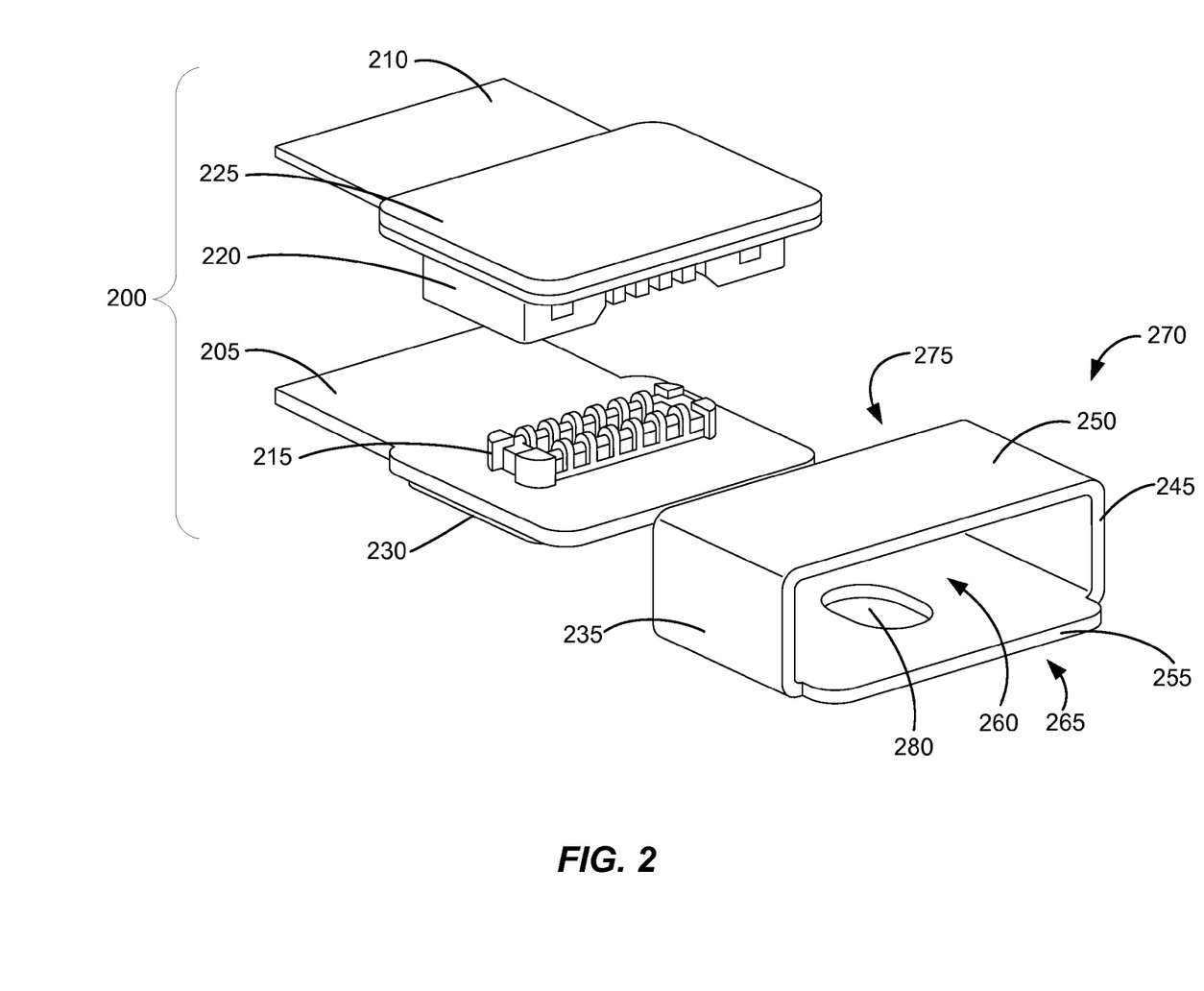
FIG. 2 is a diagram that illustrates a top perspective view of a pair of electrical connectors and a shell in accordance with an embodiment of the invention.

FIG. 2 is a simplified pre-assembly perspective view an exemplary connector assembly 200, in accordance with one embodiment of the invention. Connector assembly 200 may include connector plug 215 mounted to first PCB 205, connector receptacle 220 mounted to second PCB 210 and optional stiffener and/or absorber 225. Connector plug 215 may be configured to mate with connector receptacle 220 to transfer electrical signals between first PCB 205 and second PCB 210. First PCB 205 and second PCB 210 may be any structure that facilitates the routing of electrical signals, such as for example, epoxy glass layers with metallic traces, ceramic layers with metallic traces, plastic layers with metallic traces and flexible polyamide layers with metallic traces. In some embodiments, connector assembly 200 may be disposed in a connector retainer comprising shell 270. Shell 270 may have receiving opening 275 configured to receive mated connector assembly 200, and rear face 265 disposed opposite of the receiving opening. Shell 270 may further have upper wall 250 opposite lower wall 255 and first sidewall 235 opposite second sidewall 245. Walls 250, 255, 235, 245 extend between receiving opening 275 and rear face 265, defining cavity 260 that communicates with receiving opening 275. In some embodiments, rear face 265 may be open as illustrated in FIG. 2, while in other embodiments it may be at least partially closed. In further embodiments, lower wall 255 may have one or more penetrations 280. In some embodiments, second PCB 210 may have stiffener and/or absorber 225 disposed on a surface opposite of connector receptacle 220, which will be discussed in more detail below. In further embodiments, first PCB 205 may have first adhesive 230 disposed on a surface opposite of connector plug 215.

Figure 3:
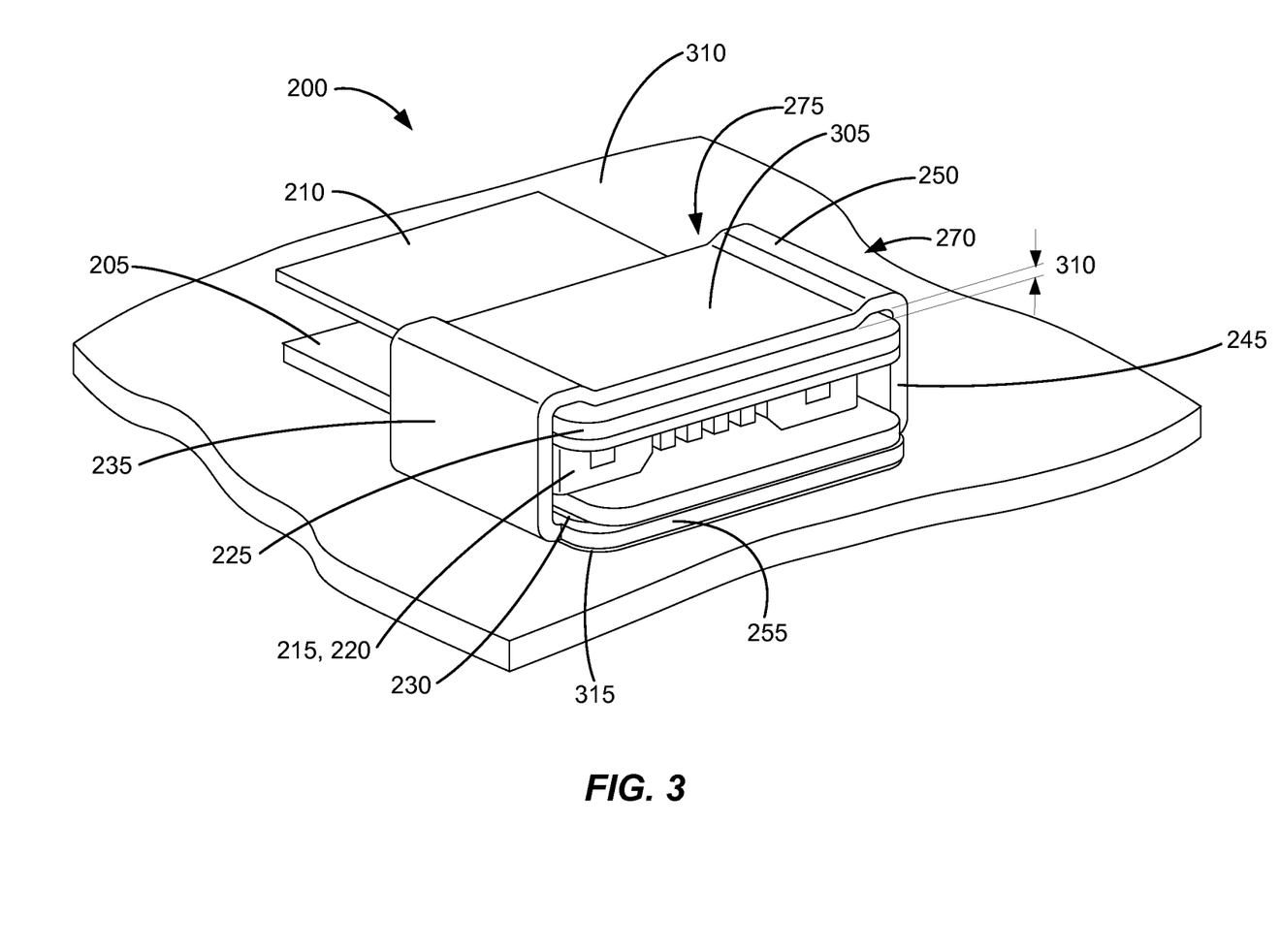
FIG. 3 is a diagram that illustrates a top perspective view of a pair of electrical connectors and a shell in accordance with an embodiment of the invention.

A simplified post-assembly perspective view of connector assembly 200 and shell 270 is shown in FIG. 3. Connector plug 215 is mated with connector receptacle 220 and shell 270 has received connector assembly 200 through receiving opening 275 and within cavity 260. Further, a portion 305 of upper wall 250 has been deflected towards lower wall 255 a distance 310 and is retained in a deflected position. Retaining deflected portion 305 of upper wall 250 in a deflected position may apply a compressive force on mated connectors 215, 220, securing them in the mated position.

In some embodiments, shell 270 may be made from metal and the deflection of upper wall 250 may be achieved by pressing on deflected portion 305 with a tool. This may cause the metal to deform or crimp and maintain deflected portion 305 in the deflected position. In other embodiments where shell 270 may be made from a thermoplastic material, the deflection of upper wall 250 may be achieved by pressing on deflected portion 305 with a heated tool. This may cause the thermoplastic material to soften, allowing the tool to deflect a portion 305 of upper wall 250. The tool may then be removed, or may be cooled then removed, leaving deflected portion 305 of upper wall 250 in the deflected position. Deflected portion 305 of upper wall 250 may not look similar to the representation in FIG. 3 and may comprise more than one deflected portion, a smaller deflected portion and/or a larger deflected portion. For example, in some embodiments deflected portion 305 of upper wall 250 may be a single concave deformation or multiple concave deformations in upper wall 250.

In some embodiments, shell 270 may be made from a metal or a plastic material, such as for example, steel, stainless steel, copper alloys, tin, thermoplastic polymer or thermoset polymer. In some embodiments where shell 270 is made from metal, the metal may be blanked, formed and joined together to form a closed shape. Such techniques are well-known in the art and myriad manufacturing technologies may be employed. For example, one embodiment may employ similar manufacturing processes that are used to make Universal Serial Bus connectors comprising interlocking one end of a stamped formation to another end and swaging them together. In embodiments where shell 270 is made from plastic, it may be formed by molding, extruding or other plastic component manufacturing technologies. Some embodiments may dispose one or more layers of plating, paint, anodization coatings or other coatings on shell 270. In one embodiment, shell 270 is made from stainless steel that is plated with nickel. In some embodiments, shell 270 may have a thickness between 0.05 mm and 0.40 mm. In further embodiments it may have a thickness between 0.10 mm and 0.35 mm. In still further embodiments it may have a thickness between 0.15 mm and 0.30 mm. Further embodiments, some of which are described below, may use similar materials and manufacturing techniques.

Shell 270 may affect the size, cost and/or the ease of assembly of connector assembly 200 in myriad ways. First, shell 270 is relatively thin and in many embodiments is only slightly larger than mated connector 215, 220, thus it consumes little space, leaving room for other components within the electronic device. Further, shell 270 is relatively easy to manufacture from low cost materials. In some embodiments, shell 270 is made from sheet metal that is formed or welded together. Also, in some embodiments, shell 270 may require only a simple tool or manipulation by an assembler to cause the deflection and retention of upper wall 250. In some embodiments, a simple metal bar may be pressed by hand against deflected portion 305 of upper wall 250 to cause the deflection while other embodiments may employ a folding and latching structure, as discussed in more detail below.

Some embodiments of connector assembly 200 may include stiffener and/or absorber 225 in, while other embodiments may not. Embodiments that employ stiffener and/or absorber 225 may employ a stiffener only, an absorber only or both a stiffener and an absorber. The stiffener may be a relatively rigid plate that may help distribute the forces imparted by deflected portion 305 of upper wall 250 across a larger area of second PCB 210. In some embodiments, the stiffener may be made from a metal, such as for example, steel, stainless steel, or a copper alloy. The absorber may be a relatively flexible and compressible material that may act as an intermediate "spring" between deflected portion 305 and board-to-board connector 215, 220 and PCBs 205, 210. More specifically, when deflected portion 305 is deflected towards lower wall 255, the absorber may enable the deflected portion to apply a compressive force to mated connector 215, 220 without causing damage to the connector. The "spring" effect of the absorber may leave the absorber in a partially compressed state after the deflection operation. This may make the deflection operation require less precision and may enable shell 270 to maintain mated connector 215, 220 in a fully mated position even after many years of environmental stress. In some embodiments, the absorber may be made from a polymer, such as for example, rubber, foam, silicone or a viscoelastic material. In embodiments that employ both a stiffener and an absorber the structure may comprise two parallel plates with one being the stiffener and the other being the absorber. In some embodiments, the stiffener may be proximate second PCB 210 while in other embodiments absorber may be proximate the PCB. In further embodiments, stiffener and/or absorber may be disposed between lower wall 255 and first PCB 205.

Further embodiments may employ first adhesive 230 on the interior surface of lower wall 255 and/or the interior surface of upper wall 250 to maintain mated connector assembly 200 within shell 270. Other embodiments may employ second adhesive 315 between shell 270 and mounting surface 310. Some embodiments of shell 270 may have one or penetrations 280 (see FIG. 2) in lower wall 255 that facilitate adhesion of first and second adhesive 230, 315, respectively, to shell 270.

Figure 4:
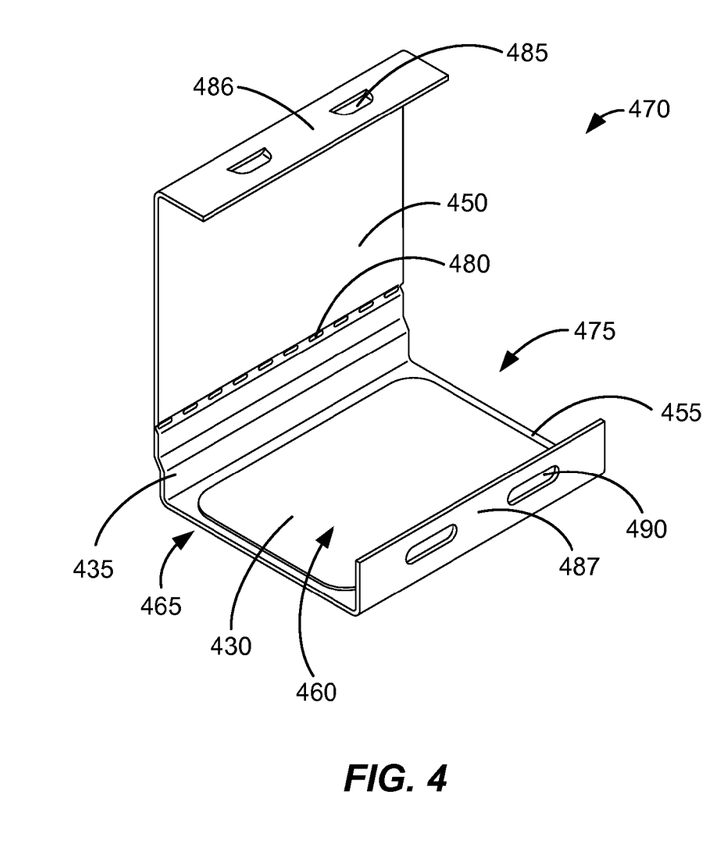
FIG. 4 is a diagram that illustrates a top perspective view of a shell in accordance with an embodiment of the invention.
Figure 5:
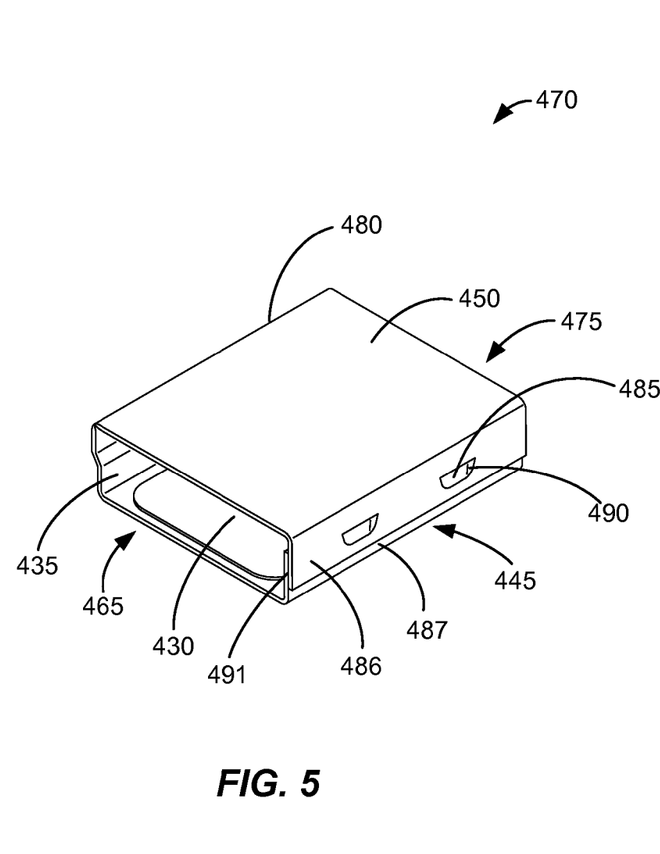
FIG. 5 is a diagram that illustrates a top perspective view of a shell in accordance with an embodiment of the invention.

In some embodiments, as depicted in FIGS. 4 and 5, shell 470 may comprise a folding and latching structure. Shell 470 is shown in the open position in FIG. 4, prepared to receive mated connector assembly 200 (see FIG. 3). Shell 470 may have a receiving opening 475, and rear face 465 disposed opposite of the receiving opening. Shell 470 may further have upper wall 450 opposite (when in the closed position depicted in FIG. 5) lower wall 455 and first sidewall 435 opposite second sidewall 445 (when in the closed position depicted in FIG. 5). In this embodiment, second sidewall 445 may comprise upper wall lip 486 overlapped with lower wall lip 487, forming overlapping portion 491, as illustrated in FIG. 5. Walls 450, 455, 435, 445 extend between receiving opening 475 and rear face 465, defining cavity 460 that communicates with the receiving opening. In some embodiments, rear face 465 may be open, as illustrated in FIGS. 4 and 5, while in other embodiments it may be at least partially closed. In further embodiments, lower wall 455 may have one or more penetrations (not shown). First sidewall 435 may be hingedly connected to upper wall 450 with hinge structure 480. Hinge structure 480 may be located anywhere on first sidewall 435 or where the first sidewall joins with upper wall 450, or where it joins lower wall 455. The latching structure may comprise upper wall lip 486 having one or more teeth 485 sized to be received within corresponding recesses 490 disposed in lower wall lip 487.

In some embodiments, recesses 490 may comprise indentations while in other embodiments the recesses may comprise penetrations while in further embodiments the recesses may comprise a combination of indentations and penetrations. In some embodiments, teeth 485 may comprise a protrusion from lip 486 configured to latch and/or catch on recess 490. Other embodiments may employ a different latching structure, such as for example, a pair of protrusions configured to latch and/or catch on each other. In some embodiments the location of recesses 490 and teeth 485 may be reversed wherein the recesses may be located where the teeth are located and the teeth may be located where the recesses are located. As discussed above, lower wall 455 or upper wall 450 may include first adhesive 430 disposed on an interior surface for securing mated connector assembly 200 (see FIG. 3) within shell 470.

Mated connector assembly 200 (see FIG. 3) may be disposed within cavity 460 of shell 470 when the shell is in the open position, depicted in FIG. 4. At least a portion of upper wall 450 may then be deflected towards lower wall 455. In this embodiment the entire upper wall 450 may be deflected towards lower wall 455 by the operation of hinge structure 480. Upper wall 450 may be deflected towards lower wall 455 until teeth 485 in upper wall lip 486 engage with recesses 490 disposed in lower wall lip 487, forming second sidewall 445. Once teeth 485 are engaged with recesses 490, upper wall 450 is retained in the deflected "closed" position, illustrated in FIG. 5. Retaining upper wall 450 in the deflected position may apply a compressive force on mated connectors 215, 220 (see FIG. 3), securing them in the mated position. In some embodiments that employ optional stiffener and/or absorber 225 (see FIG. 3), the absorber may act as a spring, holding mated connector 215, 220 in the mated position. In other embodiments, shell 470 may not employ stiffener and/or absorber 225 (see FIG. 3), wherein upper wall 450 and lower wall 455 may maintain mated connector 215, 220 in the mated position.

In some embodiments, shell 470 may be made from a metal or a plastic material, such as for example, steel, stainless steel, copper alloys, tin, thermoplastic or a thermoset. Myriad materials and manufacturing technologies may be employed, as discussed above, to manufacture shell 470. In some embodiments, shell 470 may be easier to assemble than shell 270 (see FIG. 3). Shell 470 may simply require an operator or a machine to push upper wall 450 towards lower wall 455 until teeth 485 engage with recesses 490, whereas some embodiments employing shell 270 (see FIG. 3) may require a tool to deflect upper wall 250. This may make shell 470 less costly to assemble than shell 270 (see FIG. 3).

Figure 6:
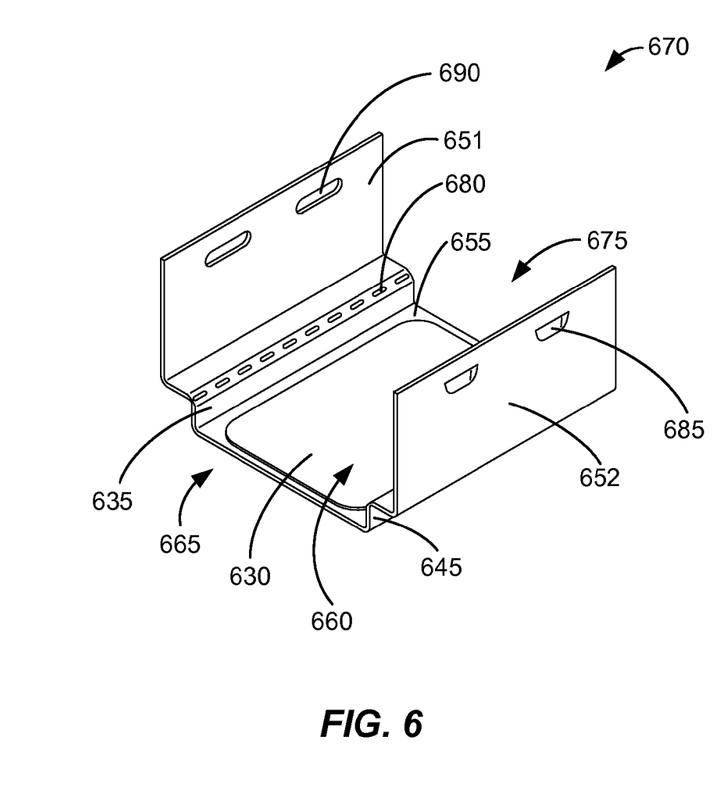
FIG. 6 is a diagram that illustrates a top perspective view of a shell in accordance with an embodiment of the invention.
Figure 7:
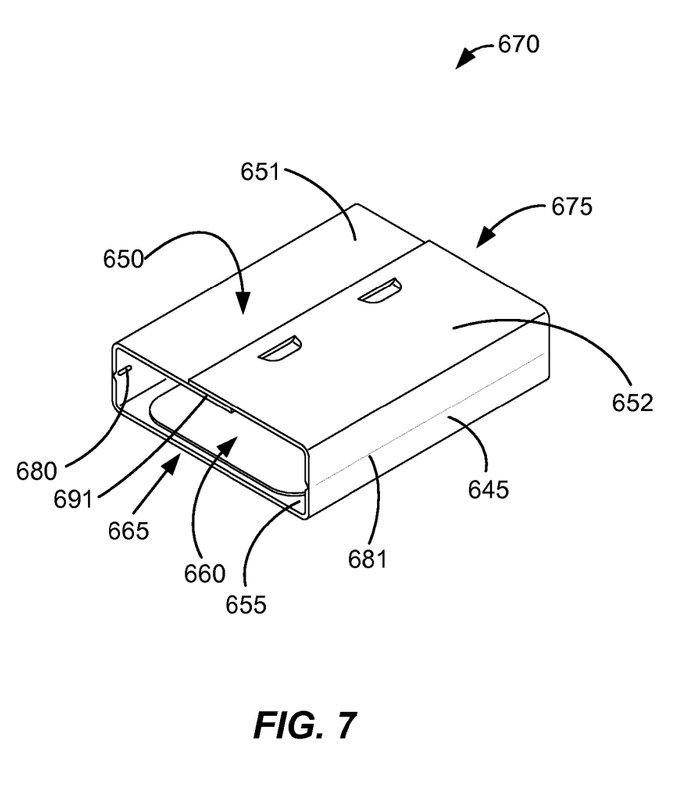
FIG. 7 is a diagram that illustrates a top perspective view of a shell in accordance with an embodiment of the invention.

Further embodiments, as depicted in FIGS. 6 and 7, may also comprise a folding and latching structure. Shell 670 is shown in the open position in FIG. 6, prepared to receive mated connector assembly 200 (see FIG. 3). Shell 670 may have receiving opening 675, and rear face 665 disposed opposite of the receiving opening. Shell 670 may further have first upper wall portion 651 and second upper wall portion 652 which, when in the closed position, as illustrated in FIG. 7, have an overlap portion 691 forming upper wall 650. Upper wall 650 is disposed opposite lower wall 655, and first sidewall 635 is disposed opposite second sidewall 645. Walls 650, 655, 635, 645 extend between receiving opening 675 and rear face 665, defining cavity 660 that communicates with the receiving opening. In some embodiments, rear face 665 may be open as illustrated in FIGS. 6 and 7, while in other embodiments it may be at least partially closed. In further embodiments, lower wall 655 may have one or more penetrations (not shown). First sidewall 635 may be hingedly connected to first upper wall portion 651 with hinge structure 680. Hinge structure 680 may be located anywhere on first sidewall 635 or where the first sidewall joins with upper wall portion 651, or where it joins with lower wall 655. Second sidewall 645 may be hingedly connected to second upper wall portion 652 with hinge structure 681. Hinge structure 681 may be located anywhere on second sidewall 645 or where the second sidewall joins with upper wall portion 652 or where it joins with lower wall 655.

Some embodiments may employ a latching structure comprising second upper wall portion 652 having one or more teeth 685 disposed proximate overlapping portion 691, sized and configured to be received within corresponding recesses 690 disposed in first upper wall portion 651. Other embodiments may employ a different latching structure. In some embodiments the location of recesses 690 and teeth 685 may be reversed wherein the recesses may be located where the teeth are located and the teeth may be located where the recesses are located. Lower wall 655 or upper wall 650 may include first adhesive 630 disposed on an interior surface, for securing mated connector assembly 200 (see FIG. 3) within shell 670.

Mated connector assembly 200 (see FIG. 3) may be disposed within cavity 660 of shell 670 when the shell is in the open position depicted in FIG. 6. At least a portion of upper wall 650, comprising first upper wall portion 651 and second upper wall portion 562, may then be deflected towards lower wall 655. In this embodiment, both first upper wall portion 651 and second upper wall portion 562 may be deflected towards lower wall 655 by the operation of hinge structures 680, 681. First upper wall portion 651 may be deflected towards lower wall 655 until it is almost parallel with lower wall 655. Then, second upper wall portion 652 may be deflected towards lower wall 655 until teeth 685 in second upper wall portion 652 engage with recesses 690 disposed in first upper wall portion 651, forming upper wall 650. Once teeth 685 are engaged with recesses 690, upper wall 650 is retained in the deflected "closed" position, illustrated in FIG. 7. Retaining upper wall 650 in a deflected position may apply a compressive force on mated connectors 215, 220 (see FIG. 3), securing them in the mated position. In some embodiments that employ optional stiffener and/or absorber 225 (see FIG. 3), the absorber may act as a spring, holding mated connectors 215, 220 in the mated position. In other embodiments, shell 670 may not employ stiffener and/or absorber 225 (see FIG. 3), wherein upper wall 650 and lower wall 655 may maintain mated connector 215, 220 in the mated position.

In some embodiments, shell 670 may be made from a metal or a plastic material, such as for example, steel, stainless steel, copper alloys, tin, thermoplastic or a thermoset. Myriad materials and manufacturing technologies may be employed, as discussed above, to manufacture shell 670.

Figure 8:
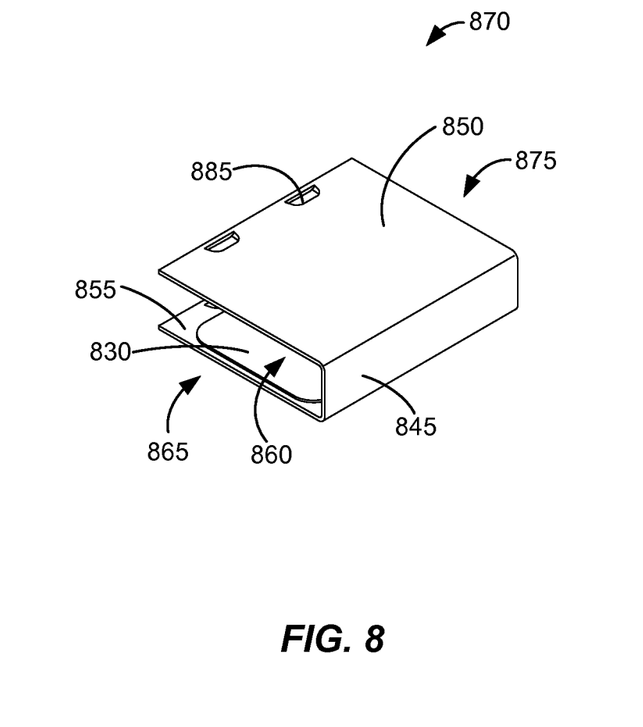
FIG. 8 is a diagram that illustrates a top perspective view of a shell in accordance with an embodiment of the invention.

Further embodiments, as depicted in FIG. 8, may also comprise a latching structure. Shell 870 is prepared to receive mated connector assembly 200 (see FIG. 3). Shell 870 may have a receiving opening 875, and rear face 865 disposed opposite of the receiving opening. Shell 870 may further have upper wall 850 disposed opposite lower wall 855, and first sidewall 845 disposed between the upper wall and the lower wall. Walls 850, 855, 845 extend between receiving opening 875 and rear face 865, defining cavity 860 that communicates with the receiving opening. In some embodiments, rear face 865 may be open, as illustrated in FIG. 8, while in other embodiments it may be at least partially closed. In some embodiments, a distal end of upper wall 850 may have one or more teeth 885 configured to protrude into cavity 860 and retain mated connector assembly 200 (see FIG. 3) within shell 870. In further embodiments, a distal end of lower wall 855 may have similar teeth 885. In other embodiments, lower wall 855 may have one or more penetrations (not shown). Lower wall 855 or upper wall 850 may include first adhesive 830 disposed on an interior surface for securing mated connector assembly 200 (see FIG. 3) within shell 870.

Mated connector assembly 200 (see FIG. 3) may be disposed within cavity 860 of shell 870. To facilitate insertion of mated connector assembly 200 (see FIG. 3), a portion of upper wall 850 may be temporarily deflected away from lower wall 855, and then allowed to deflect (or spring) towards the lower wall after insertion of the mated connector assembly. Mated connector assembly 200 (see FIG. 3) may be configured to be larger than the "free position" distance between lower wall 855 and upper wall 850 such that when upper wall is released, it may apply a compressive force on mated connector 215, 220 (see FIG. 3), securing it in the mated position. In some embodiments that employ optional stiffener and/or absorber 225 (see FIG. 3), the absorber may act as a spring, holding mated connectors 215, 220 in the mated position. In other embodiments, shell 870 may not employ stiffener and/or absorber 225 (see FIG. 3) and upper wall 850 and lower wall 855 may maintain mated connector 215, 220 in the mated position.

In some embodiments, shell 870 may be made from a metal or a plastic material, such as for example, steel, stainless steel, copper alloys, tin, thermoplastic or a thermoset. Myriad materials and manufacturing technologies may be employed, as discussed above, to manufacture shell 870.

Figure 9:
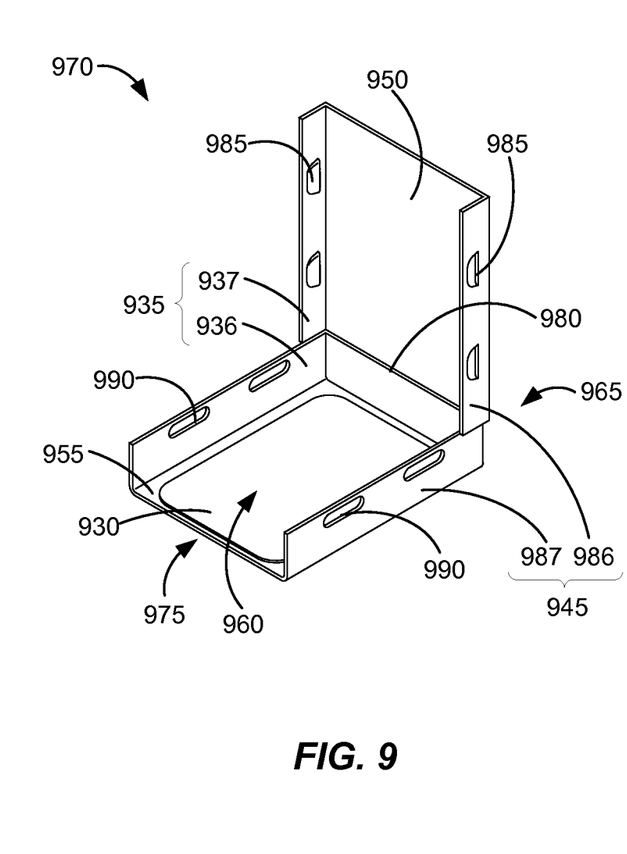
FIG. 9 is a diagram that illustrates a top perspective view of a shell in accordance with an embodiment of the invention.

In some embodiments, as depicted in FIG. 9, shell 970 may comprise a folding and latching structure. Shell 970 is shown in the open position in FIG. 9, prepared to receive mated connector assembly 200 (see FIG. 3). Shell 970 may also have a closed position wherein upper wall 950 is folded about hinge structure 980 such that it is substantially parallel to lower wall 955. Shell 970 may have a receiving opening 975, and rear face 965 disposed opposite of the receiving opening. Shell 970 may further have upper wall 950 opposite (when in the closed position) lower wall 955. In this embodiment, when shell 970 is in the closed position, it may have first sidewall 935 comprising first upper wall lip 985 overlapped with first lower wall lip 936. Additionally, when shell 970 is in the closed position it may have second sidewall 945 comprising first upper wall lip 986 overlapped with first lower wall lip 987. Further, when shell 970 is in the closed position, walls 950, 955, 935, 945 extend between receiving opening 975 and rear face 965, defining cavity 960 that communicates with the receiving opening. In some embodiments, rear face 965 may be closed as illustrated in FIG. 9, while in other embodiments it may be at least partially open. In further embodiments, lower wall 955 may have one or more penetrations (not shown). Rear face 965 may be hingedly connected to upper wall 950 with hinge structure 980. Hinge structure 980 may be located anywhere on rear face 965 or where the rear face joins with upper wall 950 or where rear face joins with lower wall 955. A latching structure may comprise first upper wall lip 937 and second upper wall lip 986, each having one or more teeth 985 sized to be received within corresponding recesses 990 disposed in first lower wall lip 936 and second lower wall lip 987. Other embodiments may employ a different latching structure. In some embodiments the location of recesses 990 and teeth 985 may be reversed wherein the recesses may be located where the teeth are located and the teeth may be located where the recesses are located. Lower wall 955 or upper wall 950 may include first adhesive 930 disposed on an interior surface for securing mated connector assembly 200 (see FIG. 3) within shell 970.

Mated connector assembly 200 (see FIG. 3) may be disposed within cavity 960 of shell 970 when the shell is in the open position depicted in FIG. 9. At least a portion of upper wall 950 may then be deflected towards lower wall 955. In this embodiment, the entire upper wall 950 may be deflected towards lower wall 955 by the operation of hinge structure 980. Upper wall 950 is deflected towards lower wall 955 until teeth 985 in first and second upper wall lips 937, 986, respectively, engage with recesses 990 disposed in first and second lower wall lips 936, 987, respectively, forming first and second sidewalls 935, 945, respectively. Once teeth 985 are engaged with recesses 990, upper wall 950 is retained in the deflected "closed" position. Retaining upper wall 950 in the deflected position may apply a compressive force on mated connectors 215, 220 (see FIG. 3), securing them in the mated position. In some embodiments that employ optional stiffener and/or absorber 225 (see FIG. 3), the absorber may act as a spring, holding mated connector 215, 220 in the mated position. In other embodiments, shell 970 may not employ stiffener and/or absorber 225 (see FIG. 3) and upper wall 950 and lower wall 955 may maintain mated connector 215, 220 in the mated position.

In some embodiments, shell 970 may be made from a metal or a plastic material, such as for example, steel, stainless steel, copper alloys, tin, thermoplastic or a thermoset. Myriad materials and manufacturing technologies may be employed, as discussed above, to manufacture shell 970.

Figure 10:
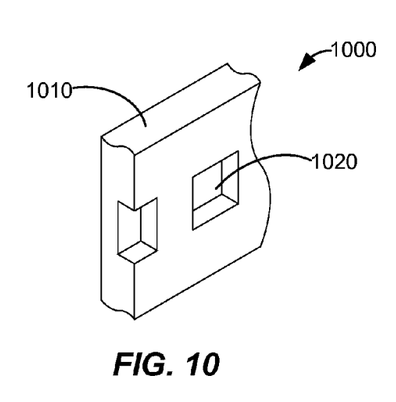
FIG. 10 is a diagram that illustrates a top perspective view of a hinge structure in accordance with an embodiment of the invention.

As discussed above, some embodiments may employ one or more hinge structures. As an example, some embodiments may employ hinge structure 1000, illustrated in FIG. 10. Representative wall portion 1010, which may be any wall of a shell, may have a series of depressions 1020. In some embodiments, the depth of depressions 1020 may be between 10 percent and 90 percent of the wall thickness. In other embodiments the depth of depressions 1020 may be between 20 percent and 80 percent of the wall thickness. In further embodiments the depth of depressions 1020 may be between 30 percent and 70 percent of the wall thickness. Depressions 1020 may be any shape, such as for example, square, rectangular, circular or oval. The spacing between depressions 1020 may vary and in some embodiments there may be no space between the depressions resulting in a single continuous depression in representative wall portion 1010. The depth, spacing and geometry of depressions 1020 may be used to change the characteristics of hinge structure 1000. For example, if a relatively strong material such as stainless steel is used for the shell, the depth of depressions 1020 may be relatively deep with little space between them to make the hinge easier to operate. Conversely, if a relatively weak material such as tin is used for the shell, the depth of depressions 1020 may be relatively shallow with large spaces between them to make the hinge stronger and less susceptible to breaking.

Figure 11:
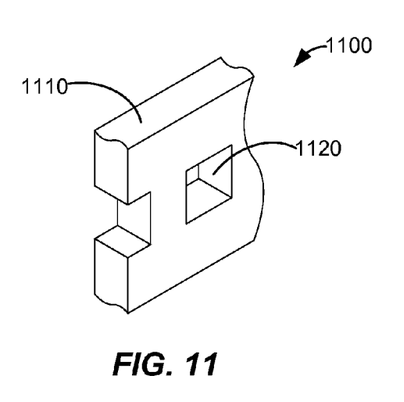
FIG. 11 is a diagram that illustrates a top perspective view of a hinge structure in accordance with an embodiment of the invention.

Myriad hinge structures may be used in further embodiments. For example, hinge structure 1100 is illustrated on representative wall portion 1110 and has a series of penetrations 1120. Penetrations 1120 may be any shape, such as for example, square, rectangular, circular or oval. The spacing between penetrations 1120 may vary. The depth, spacing and geometry of penetrations 1120 may be used to change the characteristics of hinge structure 1100. For example, if a relatively strong material such as stainless steel is used for the shell, there may be little space between them to make the hinge easier to operate. Conversely, if a relatively weak material such as tin is used for the shell, there may be relatively large spaces between them to make the hinge stronger and less susceptible to breaking.

Figure 12:
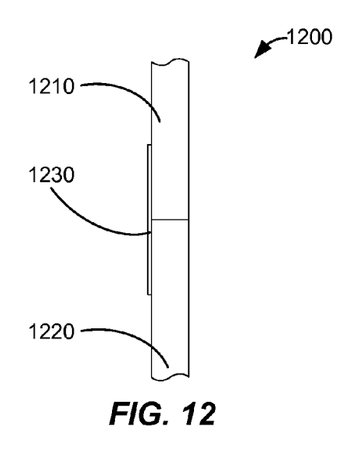
FIG. 12 is a diagram that illustrates a side view of a hinge structure in accordance with an embodiment of the invention.
Figure 13:
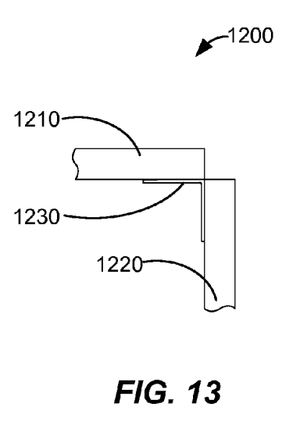
FIG. 13 is a diagram that illustrates a side view of a hinge structure in accordance with an embodiment of the invention.

Further embodiments may employ alternative hinge structures, other than depressions or penetrations. FIGS. 12 and 13 illustrate example hinge structure 1200, having top wall portion 1210 and lower wall portion 1220 coupled by flexible membrane 1230. As illustrated in FIG. 13, top wall portion 1210 may be articulated relative to lower wall portion 1220 with flexible membrane 1230 allowing relative articulation but not translation of the wall portions relative to each other. In some embodiments, flexible membrane 1230 may comprise, for example, a polymeric tape, a metallic tape, or other relatively flexible material. In further embodiments, top wall portion 1210 may be articulated in the opposite direction shown in FIG. 13. In some embodiments, a gap may be left between top wall portion 1210 and lower wall portion, or flexible membrane 1230 may stretch in the transverse direction along the hinge area.

Figure 14:
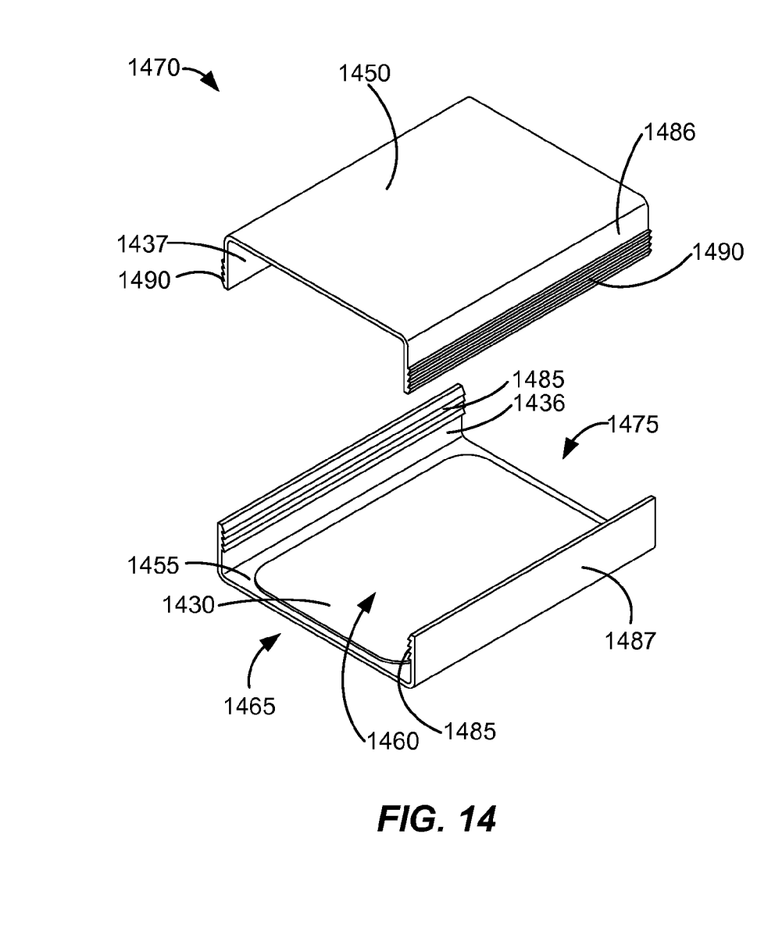
FIG. 14 is a diagram that illustrates a top perspective view of a shell in accordance with an embodiment of the invention.
Figure 15:
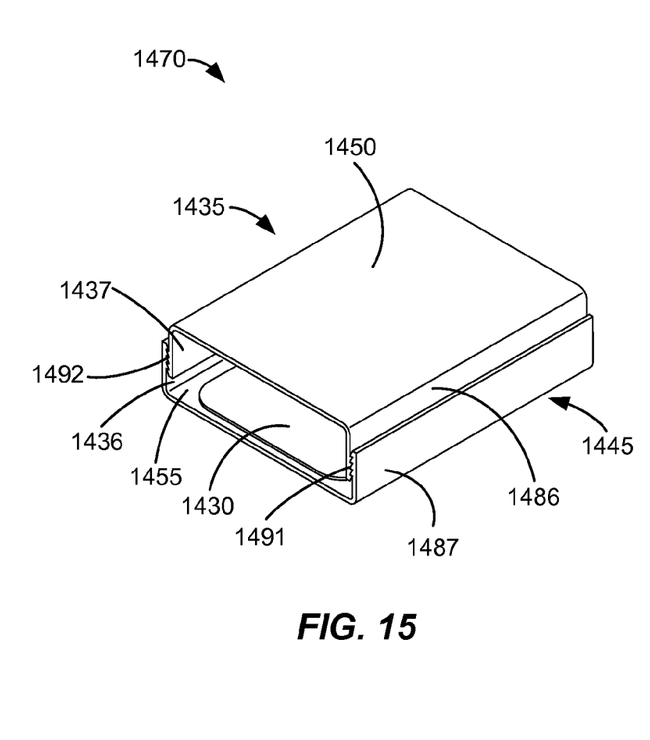
FIG. 15 is a diagram that illustrates a top perspective view of a shell in accordance with an embodiment of the invention.

In some embodiments, as depicted in FIGS. 14 and 15, shell 1470 may comprise two pieces interconnected with a latching structure. Shell 1470 is shown in the open position in FIG. 14, prepared to receive mated connector assembly 200 (see FIG. 3). Shell 1470 may also have a closed position as illustrated in FIG. 15. As further shown in FIG. 15, shell 1470 may have a receiving opening 1475, and rear face 1465 disposed opposite of the receiving opening. Shell 1470 may also have upper wall 1450 opposite (when in the closed position depicted in FIG. 15) lower wall 1455 and first sidewall 1435 opposite second sidewall 1445 (when in the closed position depicted in FIG. 15). In this embodiment, first sidewall 1435 may comprise first upper wall lip 1437 overlapped with first lower wall lip 1436 forming first overlap portion 1492. Second sidewall 1445 may comprise second upper wall lip 1486 overlapped with second lower wall lip 1487 forming second overlap portion 1491. As further illustrated in FIG. 15, walls 1450, 1455, 1435, 1445 extend between receiving opening 1475 and rear face 1465, defining cavity 1460 that communicates with the receiving opening. In some embodiments, rear face 1465 may be open as illustrated in FIGS. 14 and 15, while in other embodiments it may be at least partially closed. In further embodiments, lower wall 1455 may have one or more penetrations (not shown).

In some embodiments, shell 1470 may comprise a latching structure where first upper wall lip 1437 has one or more recesses 1490 configured to receive teeth 1485 disposed in first lower wall lip 1436. Further, second upper wall lip 1486 may have one or more recesses 1490 configured to receive teeth 1485 disposed in second lower wall lip 1487. In some embodiments, teeth 1485 may be similar to recesses 1490 while in other embodiments they may be different designs. Other embodiments may employ a different latching structure. In some embodiments the location of recesses 1490 and teeth 1485 may be reversed wherein the recesses may be located where the teeth are located and the teeth may be located where the recesses are located. Lower wall 1455 or upper wall 1450 may include first adhesive 1430 disposed on an interior surface for securing mated connector assembly 200 (see FIG. 3) within shell 1470.

Mated connector assembly 200 (see FIG. 3) may be disposed within cavity 1460 of shell 1470 when the shell is in the open position, depicted in FIG. 14. Upper wall 1450 may then be aligned with and deflected towards lower wall 1455. Upper wall 1450 may be deflected towards lower wall 1455 until teeth 1485 disposed in first and second lower wall lips 1436, 1487, respectively, engage with recesses 1490 disposed in first and second upper wall lips 1437, 1486, respectively, forming first and second sidewalls 1435, 1445, respectively. Once teeth 1485 are engaged with recesses 1490, upper wall 1450 is retained in the deflected "closed" position, illustrated in FIG. 15. Retaining upper wall 1450 in the deflected position may apply a compressive force on mated connectors 215, 220 (see FIG. 3), securing them in the mated position. In some embodiments that employ optional stiffener and/or absorber 225 (see FIG. 3), the absorber may act as a spring, holding mated connector 215, 220 in the mated position. In other embodiments, shell 1470 may not employ stiffener and/or absorber 225 (see FIG. 3) and upper wall 1450 and lower wall 1455 may maintain mated connector 215, 220 in the mated position.

In some embodiments, shell 1470 may be made from a metal or a plastic material, such as for example, steel, stainless steel, copper alloys, tin, thermoplastic or a thermoset. Myriad materials and manufacturing technologies may be employed, as discussed above, to manufacture shell 1470.

Figure 16:
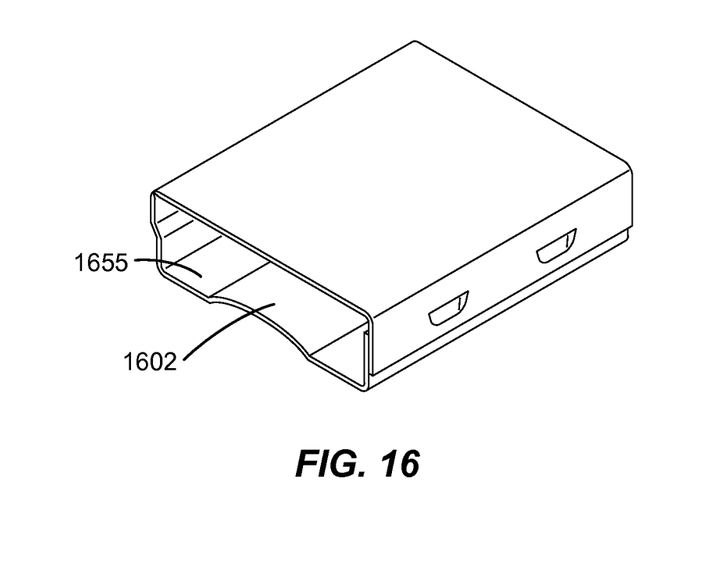
FIG. 16 is a diagram that illustrates a top perspective view of a shell with a flexible depression in accordance with an embodiment of the invention.
Figure 17:
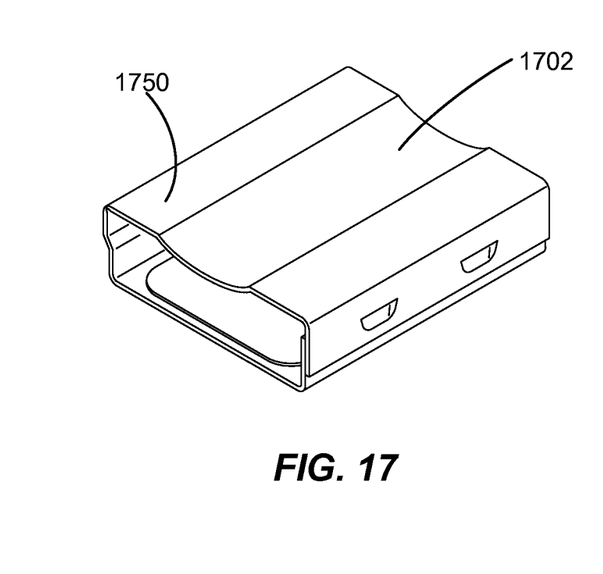
FIG. 17 is a diagram that illustrates a top perspective view of a shell with a flexible depression in accordance with an embodiment of the invention.

It will be appreciated that the embodiments described herein are illustrative and that variations and modifications are possible. For instance, some embodiments may comprise a shell having one or more flexible depressions 1602, 1702 as illustrated in FIGS. 16 and 17. The shell design illustrated here is for example only and any embodiment may incorporate one or more flexible depressions 1602, 1702 disposed in upper wall 1650 as depicted in FIG. 16 or in lower wall 1755 as depicted in FIG. 17. Flexible depressions may be formed to flex, acting like a spring, and may aid in applying a compressive force on mated connectors 215, 220 (see FIG. 3), securing them in the mated position. In some embodiments, flexible depressions 1602, 1702 may be used with stiffener and/or absorber 225 (see FIG. 3) while other embodiments may not use stiffener and/or absorber. Further embodiments may only employ the stiffener, without the absorber while other embodiments may only employ the absorber without the stiffener. Further embodiments may dispose more than one electronic connector within a shell. Still further embodiments may employ more than one flexible depression, with each depression configured to align with each of the electrical connectors disposed in the shell.

Some embodiments may utilize the shell for electromagnetic interference (EMI) shielding. Further embodiments may desire the electronic connector residing within the cavity of the shell to be shielded from external EMI while other embodiments may desire the shell to shield adjacent components from EMI radiated from the connector. Some embodiments may employ a metallic shell or a shell that is made from electrically conductive plastic to aid in EMI shielding. The shell may be connected to ground to improve the effectiveness of the EMI shield. In some embodiments the EMI effectiveness of the shell may be improved by substantially enclosing all six sides of the mated connector assembly within the shell and disposing minimally sized slots in one or more sides of the shell for the PCB's to egress.

Further embodiments may employ an elastomer band around the mated connector assembly while other embodiments may employ an elastomer band around a shell that is disposed around the mated connector assembly. The elastomer band may apply a compressive force to the mated connectors that may maintain them in the mated position when they are subjected to environmental stress. In some embodiments the elastomer band may include conductive material and aid in EMI shielding. Other embodiments may employ an elastomer band having five sides forming a boot that may substantially enclose a mated connector assembly, except for one side.

Some embodiments may connect the shell to ground with a wire, a terminal or another type of conductive member. Further embodiments may connect the shield to ground with an electrically conductive adhesive. Such adhesives may be disposed between the shell and the chassis to which the shell is connected. Such adhesives may also be used between the shell and the connector assembly. For example, one embodiment may employ a first conductive adhesive between the shell and one or more of the PCB's within the shell and a second conductive adhesive between the shell and the mounting surface.

Figure 18:
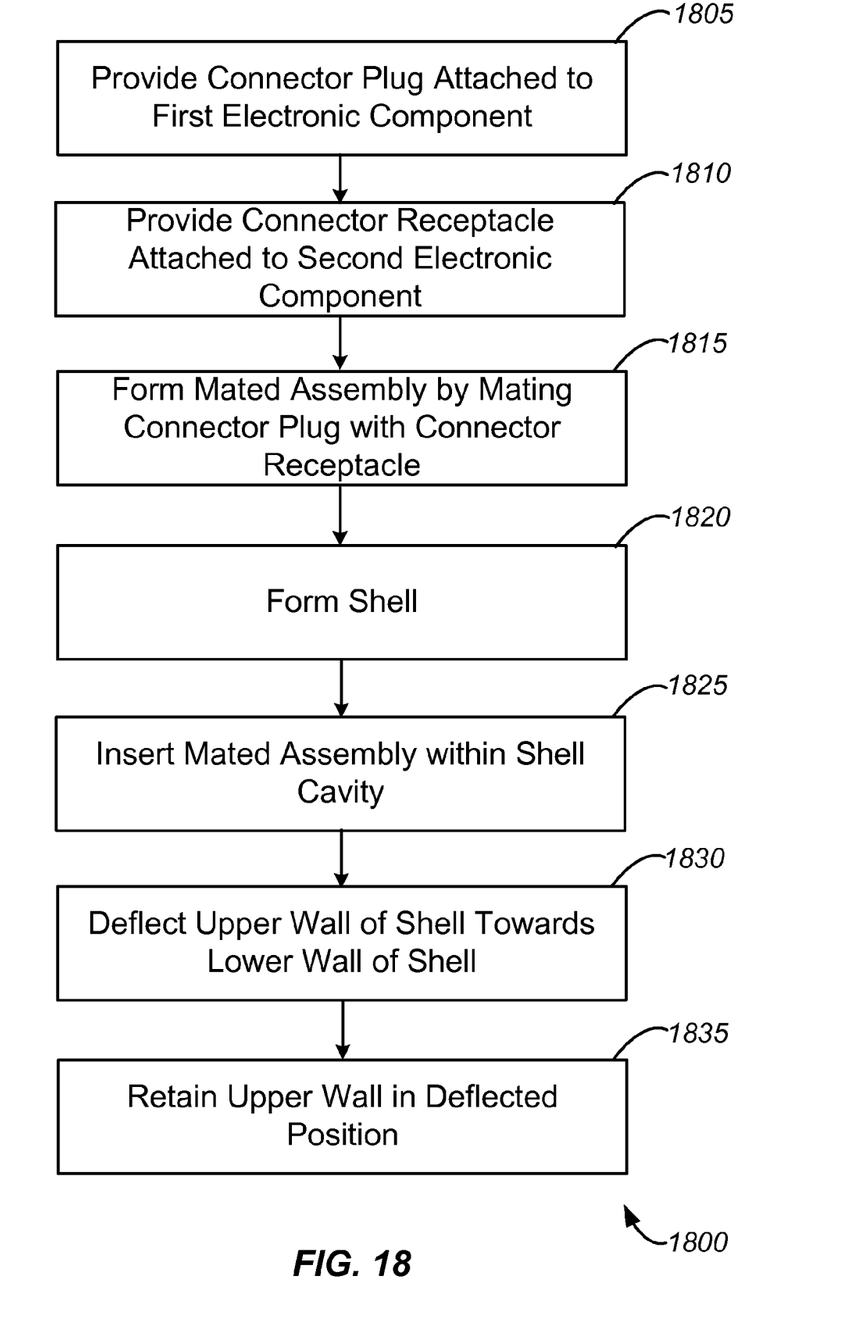
FIG. 18 is a process by which a retention mechanism can be employed on an electronic connector in accordance with an embodiment of the invention.

FIG. 18 illustrates an exemplary simplified process 1800 for employing a retention mechanism on an electronic connector, in accordance with embodiments described herein. In step 1805 a connector plug is provided that is attached to a first electronic component. In step 1810 a connector receptacle is provided that is attached to a second electronic component. In step 1815 the connector plug is mated with the connector receptacle. In step 1820 a shell is formed. In some embodiments the shell may be made from metal while in other embodiments it may be made from a plastic. In some embodiments the shell may have a hinge and latching structure while in others it may have neither. Further embodiments may have only a latching structure with no hinge structure. In step 1825 the mated connector assembly is inserted in the cavity of the shell. In step 1830 the upper wall of the shell is deflected towards the lower wall of the shell. In step 1835 the upper wall is retained in the deflected position, securing the connectors in the mated position.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. An electrical connector assembly comprising:
a first printed circuit board having a receptacle connector;
a second printed circuit board having a plug connector mated with the receptacle connector;
a shell having a receiving opening configured to receive the mated receptacle and plug connectors, a rear face disposed opposite of the receiving opening, an upper wall opposite a lower wall and a first sidewall opposite a second sidewall, the walls extending between the receiving opening and the rear face, defining a cavity that communicates with the receiving opening;
wherein the mated plug and receptacle connectors are disposed within the cavity; and
at least a portion of the upper wall is deflected towards the lower wall and retained in a deflected position.

2. The electrical connector assembly set forth in claim 1 wherein the at least a portion of the upper wall is deformed.

3. The electrical connector assembly set forth in claim 1 wherein the upper wall is hingedly connected to the first sidewall.

4. The electrical connector assembly set forth in claim 1 wherein the second sidewall comprises a lip of the upper wall overlapped with a lip of the lower wall.

5. The electrical connector assembly set forth in claim 4 wherein the lip of the upper wall has recesses configured to receive teeth disposed in the lip of the lower wall.

6. The electrical connector assembly set forth in claim 1 wherein the first and second sidewalls each comprise a lip of the upper wall overlapped with a lip of the lower wall.

7. The electrical connector assembly set forth in claim 6 wherein the lips of the upper walls have recesses configured to receive teeth disposed in the lips of the lower walls.

8. The electrical connector assembly set forth in claim 1 wherein the upper wall comprises a flexible depression.

9. A method of retaining a pair of mated connectors, the method comprising:
mating a receptacle connector disposed on a first printed circuit board to a plug connector disposed on a second printed circuit board;

disposing a shell around the mated receptacle and plug connectors, the shell having a receiving opening, a rear face disposed opposite of the receiving opening, an upper wall opposite a lower wall and a first sidewall opposite a second sidewall, the walls extending between the receiving opening and the rear face, defining a cavity that communicates with the receiving opening;

deflecting at least a portion of the upper wall towards the lower wall applying pressure to the mated receptacle and plug connectors; and retaining the upper wall in a deflected position.

10. The method as in claim 9 wherein the at least a portion of the upper wall is deformed.

11. The method as in claim 9 wherein the upper wall is hingedly connected to the first sidewall.

12. The method as in claim 9 wherein the second sidewall comprises a lip of the upper wall overlapped with a lip of the lower wall.

13. The method as in claim 12 wherein the lip of the upper wall has recesses configured to receive teeth disposed in the lip of the lower wall.

14. An electrical connector assembly comprising:

a mated pair of connectors including a plug connector mated to a receptacle connector; and a shell having a receiving opening configured to receive the mated pair of connectors, a rear opening disposed opposite of the receiving opening, an upper wall opposite a lower wall and a first sidewall opposite a second sidewall, the walls extending between the receiving opening and the rear opening, defining a cavity that communicates with the receiving opening;

wherein the upper wall is hingedly connected to the first sidewall; and wherein at least a portion of the upper wall is configured to be deflected towards the lower wall and retained in a deflected position.

15. The electrical connector retainer set forth in claim 14 wherein the at least a portion of the upper wall is deformed when in the deflected position.

16. The electrical connector retainer set forth in claim 14 wherein the second sidewall comprises a lip of the upper wall overlapped with a lip of the lower wall.

17. The electrical connector retainer set forth in claim 16 wherein the lip of the upper wall has recesses configured to receive teeth disposed in the lip of the lower wall.

18. The electrical connector retainer set forth in claim 14 wherein the first and second sidewalls each comprise a lip of the upper wall overlapped with a lip of the lower wall.

19. The electrical connector retainer set forth in claim 18 wherein the lips of the upper walls have recesses configured to receive teeth disposed in the lips of the lower walls.

* * * * *